US012640699B2

(12) United States Patent
Maki et al.

(10) Patent No.: US 12,640,699 B2
(45) Date of Patent: \*May 26, 2026

(54) METHOD OF MAKING PACKAGED ACOUSTIC WAVE DEVICES WITH MULTILAYER PIEZOELECTRIC SUBSTRATE

(71) Applicant: Skyworks Solutions, Inc., Irvine, CA (US)

(72) Inventors: Keiichi Maki, Suita (JP); Hironori Fukuhara, Ibaraki (JP); Rei Goto, Osaka (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/929,077

(22) Filed: Sep. 1, 2022

(65) Prior Publication Data

US 2023/0111849 A1 Apr. 13, 2023

Related U.S. Application Data

(60) Provisional application No. 63/262,430, filed on Oct. 12, 2021, provisional application No. 63/262,431, filed on Oct. 12, 2021.

(51) Int. Cl.
*H03H 3/08* (2006.01)
*H03H 9/02* (2006.01)
*H03H 9/64* (2006.01)
(52) U.S. Cl.
CPC .......... *H03H 3/08* (2013.01); *H03H 9/02818* (2013.01); *H03H 9/02834* (2013.01); *H03H 9/6483* (2013.01)

(58) Field of Classification Search
CPC .... H03H 3/08; H03H 9/1092; H03H 9/02897; H03H 9/02559; H03H 9/6483;
(Continued)

(56) References Cited

U.S. PATENT DOCUMENTS 3,786,373 A 1/1974 Schulz et al.
3,983,515 A 9/1976 Mitchell et al.
(Continued)

FOREIGN PATENT DOCUMENTS

CN 114497114 A 5/2022
CN 115242214 A * 10/2022
(Continued)

OTHER PUBLICATIONS

Lee et al., "A cost-effective MEMS cavity packaging technology for mass production", IEEE Trans. Adv. Packaging, vol. 32(2):453-480 (2009).
(Continued)

*Primary Examiner* — Quan Tra
(74) *Attorney, Agent, or Firm* — Knobbe, Martens, Olson & Bear, LLP

(57) ABSTRACT

A method of making a surface acoustic wave package includes bonding a piezoelectric layer over a substrate and attaching a metal structure over the substrate, with the piezoelectric layer positioned between at least a portion of the substrate and at least a portion of the metal structure. The method also includes removing (e.g., etching) an outer boundary of the piezoelectric layer so that a resulting outer edge of the piezoelectric layer is spaced inward of an inner edge of the metal package (e.g., the piezoelectric layer does not contact the metal package). The method inhibit damage to the piezoelectric layer due to a stress differential between the substrate and the thermally conductive structure during a packaging process.

20 Claims, 13 Drawing Sheets

(58) Field of Classification Search
CPC .. H03H 9/02; H03H 9/02566; H03H 9/02818; H03H 9/02913; H03H 9/02574; H03H 9/02834

See application file for complete search history.

(56) References Cited

U.S. PATENT DOCUMENTS

| 4,097,825 | A | 6/1978 | Gerard |
|---|---|---|---|
| 4,204,178 | A | 5/1980 | Mitchell |
| 4,634,914 | A | 1/1987 | Ballato |
| 4,773,138 | A | 9/1988 | Ballato et al. |
| 4,996,165 | A | 2/1991 | Chang et al. |
| 5,113,115 | A | 5/1992 | Mariani |
| 5,163,435 | A | 11/1992 | Soldner et al. |
| 5,245,734 | A | 9/1993 | Issartel |
| 5,508,667 | A | 4/1996 | Kondratiev et al. |
| 5,646,584 | A | 7/1997 | Kondratyev et al. |
| 5,895,996 | A | 4/1999 | Takagi et al. |
| 5,952,899 | A | 9/1999 | Kadota et al. |
| 6,046,524 | A | 4/2000 | Yamanouchi et al. |
| 6,262,513 | B1 | 7/2001 | Furukawa |
| 6,426,583 | B1 | 7/2002 | Onishi et al. |
| 6,608,363 | B1 | 8/2003 | Fazelpour |
| 6,637,087 | B1 | 10/2003 | Horiuchi et al. |
| 7,230,512 | B1 | 6/2007 | Carpenter et al. |
| 7,733,196 | B2 | 6/2010 | Tsurunari et al. |
| 8,174,339 | B2 | 5/2012 | Matsuda et al. |
| 8,228,137 | B2 | 7/2012 | Inoue et al. |
| 8,378,760 | B2 | 2/2013 | Iwaki et al. |
| 8,482,184 | B2 | 7/2013 | Goto et al. |
| 8,836,111 | B2 | 9/2014 | Conti |
| 9,002,038 | B2 | 4/2015 | Ochs |
| 9,118,303 | B2 | 8/2015 | Inoue |
| 9,219,467 | B2 | 12/2015 | Inoue et al. |
| 9,246,533 | B2 | 1/2016 | Fujiwara et al. |
| 9,337,354 | B2 | 5/2016 | Protheroe |
| 9,438,201 | B2 | 9/2016 | Hori et al. |
| 9,484,886 | B2 | 11/2016 | Takemura |
| 9,520,857 | B2 | 12/2016 | Fujiwara et al. |
| 9,570,668 | B2 | 2/2017 | Iwamoto |
| 9,722,573 | B2 | 8/2017 | Fujiwara et al. |
| 9,822,001 | B2 | 11/2017 | Gritti |
| 10,135,422 | B2 | 11/2018 | Goto et al. |
| 10,153,909 | B2 | 12/2018 | Horváth et al. |
| 10,243,536 | B2 | 3/2019 | Saijo et al. |
| 10,483,942 | B2 | 11/2019 | Goto et al. |
| 11,050,406 | B2 | 6/2021 | Maki et al. |
| 11,133,789 | B2 | 9/2021 | Maki et al. |
| 11,222,855 | B2 | 1/2022 | Yota et al. |
| 11,309,864 | B2 | 4/2022 | Ibaragi |
| 11,368,137 | B2 | 6/2022 | Goto et al. |
| 11,387,193 | B2 | 7/2022 | Yota et al. |
| 11,431,319 | B2 | 8/2022 | Goto |
| 11,463,065 | B2 | 10/2022 | Goto |
| 11,489,513 | B2 | 11/2022 | Goto |
| 11,552,614 | B2 | 1/2023 | Caron et al. |
| 11,616,487 | B2 | 3/2023 | Nakamura et al. |
| 11,616,491 | B2 | 3/2023 | Tang et al. |
| 11,621,690 | B2 | 4/2023 | Fukuhara et al. |
| 11,658,688 | B2 | 5/2023 | Abbott et al. |
| 11,664,780 | B2 | 5/2023 | Goto et al. |
| 11,671,072 | B2 | 6/2023 | Goto et al. |
| 11,677,377 | B2 | 6/2023 | Goto et al. |
| 11,689,178 | B2 | 6/2023 | Nakamura et al. |
| 11,722,122 | B2 | 8/2023 | Goto et al. |
| 11,750,172 | B2 | 9/2023 | Goto et al. |
| 11,830,826 | B2 | 11/2023 | Yota et al. |
| 11,843,366 | B2 | 12/2023 | Fukuhara et al. |
| 11,881,837 | B2 | 1/2024 | Caron et al. |
| 11,923,822 | B2 | 3/2024 | Maki et al. |
| 12,009,795 | B2 | 6/2024 | Abbott et al. |
| 12,047,053 | B2 | 7/2024 | Maki et al. |
| 12,063,027 | B2 | 8/2024 | Goto et al. |
| 12,166,463 | B2 | 12/2024 | Goto et al. |
| 12,368,430 | B2 | 7/2025 | Goto et al. |

| 2002/0158707 | A1 | 10/2002 | Noguchi |
|---|---|---|---|
| 2002/0163402 | A1 | 11/2002 | Tsuzuki et al. |
| 2003/0011577 | A1 | 1/2003 | Katsuki et al. |
| 2004/0007079 | A1 | 1/2004 | Wilda |
| 2004/0196119 | A1 | 10/2004 | Shibahara et al. |
| 2004/0222717 | A1 | 11/2004 | Matsuda et al. |
| 2004/0232802 | A1 | 11/2004 | Koshido |
| 2006/0197630 | A1 | 9/2006 | Fuse |
| 2007/0044296 | A1 | 3/2007 | Jeon et al. |
| 2007/0080612 | A1 | 4/2007 | Terazono et al. |
| 2008/0174389 | A1 | 7/2008 | Mori et al. |
| 2008/0197941 | A1 | 8/2008 | Suzuki et al. |
| 2011/0084382 | A1 | 4/2011 | Chen |
| 2011/0254639 | A1 | 10/2011 | Tsutsumi et al. |
| 2013/0113576 | A1 | 5/2013 | Inoue et al. |
| 2014/0009032 | A1 | 1/2014 | Takahashi et al. |
| 2014/0113571 | A1 | 4/2014 | Fujiwara et al. |
| 2014/0339957 | A1 | 11/2014 | Tajima et al. |
| 2016/0028373 | A1 | 1/2016 | Costa et al. |
| 2016/0172573 | A1 | 6/2016 | Iwaki et al. |
| 2016/0226464 | A1 | 8/2016 | Fujiwara et al. |
| 2016/0268997 | A1 | 9/2016 | Komatsu et al. |
| 2017/0063332 | A1 | 3/2017 | Gilbert et al. |
| 2017/0099043 | A1 | 4/2017 | Goto et al. |
| 2017/0214386 | A1 | 7/2017 | Kido |
| 2017/0222618 | A1 | 8/2017 | Inoue et al. |
| 2017/0250669 | A1 | 8/2017 | Kuroyanagi et al. |
| 2017/0272051 | A1 | 9/2017 | Kurihara et al. |
| 2017/0273183 | A1 | 9/2017 | Kawasaki et al. |
| 2017/0288627 | A1 | 10/2017 | Takano et al. |
| 2017/0288629 | A1 | 10/2017 | Bhattacharjee et al. |
| 2017/0331456 | A1 | 11/2017 | Ono |
| 2017/0359048 | A1 | 12/2017 | Yasuda |
| 2017/0373241 | A1 | 12/2017 | Kimura |
| 2018/0013404 | A1 | 1/2018 | Kawasaki et al. |
| 2018/0069529 | A1 | 3/2018 | Bi et al. |
| 2018/0152169 | A1 | 5/2018 | Goto et al. |
| 2018/0152191 | A1 | 5/2018 | Niwa et al. |
| 2018/0262179 | A1 | 9/2018 | Goto et al. |
| 2018/0316329 | A1 | 11/2018 | Guenard et al. |
| 2018/0358406 | A1 | 12/2018 | Block et al. |
| 2018/0367119 | A1 | 12/2018 | Lee |
| 2019/0074819 | A1 | 3/2019 | Goto et al. |
| 2019/0089334 | A1 | 3/2019 | Koyanagi |
| 2019/0238114 | A1 | 8/2019 | Kishimoto et al. |
| 2019/0288661 | A1 | 9/2019 | Akiyama et al. |
| 2019/0379347 | A1 | 12/2019 | Goto et al. |
| 2020/0076402 | A1 | 3/2020 | Koo |
| 2020/0212884 | A1 | 7/2020 | Shin et al. |
| 2020/0228093 | A1 | 7/2020 | Daimon |
| 2020/0313646 | A1 | 10/2020 | Caron |
| 2020/0321937 | A1* | 10/2020 | Kishi ..................... H03F 3/72 |
| 2020/0366270 | A1 | 11/2020 | Matsuoka |
| 2021/0020587 | A1 | 1/2021 | Yota et al. |
| 2021/0036209 | A1 | 2/2021 | Osawa et al. |
| 2021/0050842 | A1 | 2/2021 | Tang et al. |
| 2021/0111688 | A1 | 4/2021 | Abbott et al. |
| 2021/0111697 | A1 | 4/2021 | Daimon et al. |
| 2021/0118821 | A1 | 4/2021 | Yota et al. |
| 2021/0119650 | A1 | 4/2021 | Abbott et al. |
| 2021/0159876 | A1 | 5/2021 | Maki et al. |
| 2021/0218381 | A1* | 7/2021 | Luo ................... H03H 9/1007 |
| 2021/0265970 | A1 | 8/2021 | Yamaji et al. |
| 2022/0014175 | A1 | 1/2022 | Nagatomo et al. |
| 2022/0077840 | A1 | 3/2022 | Caron |
| 2022/0103146 | A1* | 3/2022 | Wang .................. H03H 9/131 |
| 2022/0140814 | A1 | 5/2022 | Dyer et al. |
| 2022/0158610 | A1 | 5/2022 | Goto et al. |
| 2022/0158611 | A1 | 5/2022 | Potratz et al. |
| 2022/0158612 | A1 | 5/2022 | Goto et al. |
| 2022/0209738 | A1 | 6/2022 | Torazawa et al. |
| 2022/0271734 | A1 | 8/2022 | Abbott et al. |
| 2022/0321096 | A1 | 10/2022 | Goto et al. |
| 2022/0329227 | A1 | 10/2022 | Goto et al. |
| 2022/0399867 | A1 | 12/2022 | Goto et al. |
| 2022/0399871 | A1 | 12/2022 | Goto et al. |
| 2023/0006125 | A1 | 1/2023 | Goto et al. |
| 2023/0006636 | A1 | 1/2023 | Goto et al. |
| 2023/0006637 | A1 | 1/2023 | Goto et al. |

(56) References Cited

U.S. PATENT DOCUMENTS

| | | | |
|---|---|---|---|
| 2023/0013597 A1 | 1/2023 | Goto et al. | |
| 2023/0016884 A1 | 1/2023 | Goto et al. | |
| 2023/0028925 A1 | 1/2023 | Kobayashi | |
| 2023/0031568 A1 | 2/2023 | Tang et al. | |
| 2023/0036775 A1 | 2/2023 | Goto et al. | |
| 2023/0055758 A1 | 2/2023 | Goto et al. | |
| 2023/0062981 A1 | 3/2023 | Fukuhara et al. | |
| 2023/0069327 A1 | 3/2023 | Fukuhara et al. | |
| 2023/0070350 A1 | 3/2023 | Rei | |
| 2023/0101228 A1 | 3/2023 | Brunner | |
| 2023/0104405 A1 | 4/2023 | Hiramatsu et al. | |
| 2023/0107376 A1 | 4/2023 | Goto et al. | |
| 2023/0107820 A1 | 4/2023 | Fukuhara et al. | |
| 2023/0108686 A1 | 4/2023 | Fukuhara et al. | |
| 2023/0109106 A1 | 4/2023 | Hiramatsu et al. | |
| 2023/0110477 A1 * | 4/2023 | Maki | H03H 3/08 |
| | | | 310/346 |
| 2023/0111032 A1 * | 4/2023 | Goto | H03H 9/02574 |
| | | | 310/313 R |
| 2023/0113099 A1 | 4/2023 | Goto et al. | |
| 2023/0117464 A1 | 4/2023 | Goto et al. | |
| 2023/0118194 A1 | 4/2023 | Goto et al. | |
| 2023/0119788 A1 | 4/2023 | Goto et al. | |
| 2023/0123285 A1 | 4/2023 | Goto et al. | |
| 2023/0163748 A1 | 5/2023 | Goto et al. | |
| 2023/0208376 A1 | 6/2023 | Goto et al. | |
| 2023/0208384 A1 | 6/2023 | Goto et al. | |
| 2023/0208389 A1 | 6/2023 | Goto et al. | |
| 2023/0208398 A1 | 6/2023 | Goto et al. | |
| 2023/0208399 A1 | 6/2023 | Goto et al. | |
| 2023/0223910 A1 | 7/2023 | Goto et al. | |
| 2023/0223917 A1 | 7/2023 | Goto et al. | |
| 2023/0223919 A1 | 7/2023 | Goto et al. | |
| 2023/0225212 A1 | 7/2023 | Goto et al. | |
| 2023/0291385 A1 | 9/2023 | Okamoto et al. | |
| 2023/0327645 A1 | 10/2023 | Goto et al. | |
| 2023/0336145 A1 | 10/2023 | Goto et al. | |
| 2023/0336147 A1 | 10/2023 | Feld et al. | |
| 2023/0336153 A1 | 10/2023 | Goto et al. | |
| 2023/0344403 A1 | 10/2023 | Goto et al. | |
| 2023/0344410 A1 | 10/2023 | Goto et al. | |
| 2023/0344416 A1 | 10/2023 | Chen et al. | |
| 2023/0361755 A1 | 11/2023 | Goto | |
| 2023/0370044 A1 | 11/2023 | Goto et al. | |
| 2023/0378937 A1 | 11/2023 | Goto et al. | |
| 2023/0396233 A1 | 12/2023 | Nakamura et al. | |
| 2023/0403939 A1 | 12/2023 | Goto et al. | |
| 2024/0007079 A1 | 1/2024 | Goto et al. | |
| 2024/0039507 A1 | 2/2024 | Goto et al. | |
| 2024/0039516 A1 | 2/2024 | Goto et al. | |
| 2024/0048125 A1 | 2/2024 | Goto et al. | |
| 2024/0063773 A1 | 2/2024 | Fukuhara et al. | |
| 2024/0088870 A1 | 3/2024 | Goto et al. | |
| 2024/0178812 A1 | 5/2024 | Goto et al. | |
| 2024/0178814 A1 | 5/2024 | Goto et al. | |
| 2024/0223152 A1 | 7/2024 | Goto et al. | |

FOREIGN PATENT DOCUMENTS

| | | | | |
|---|---|---|---|---|
| JP | 2006-101092 A | 4/2006 | | |
| WO | WO-2015098679 A1 * | 7/2015 | | H03H 3/08 |
| WO | WO 2020/098481 | 5/2020 | | |
| WO | 2022/022264 A1 | 2/2022 | | |
| WO | 2022/163409 A1 | 8/2022 | | |

OTHER PUBLICATIONS

Machine Translation of Japanese Patent Publication, JP 2006-101092, Oct. 2025 (Year: 2025).

Yantchev et al., "Micromachined thin film plate acoustic resonators utilizing the lowest order symmetric lamb wave mode," in IEEE Transactions on Ultrasonics, Ferroelectrics, and Frequency Control, vol. 54, No. 1, pp. 87-95, Jan. 2007. (Year: 2007).

\* cited by examiner

250

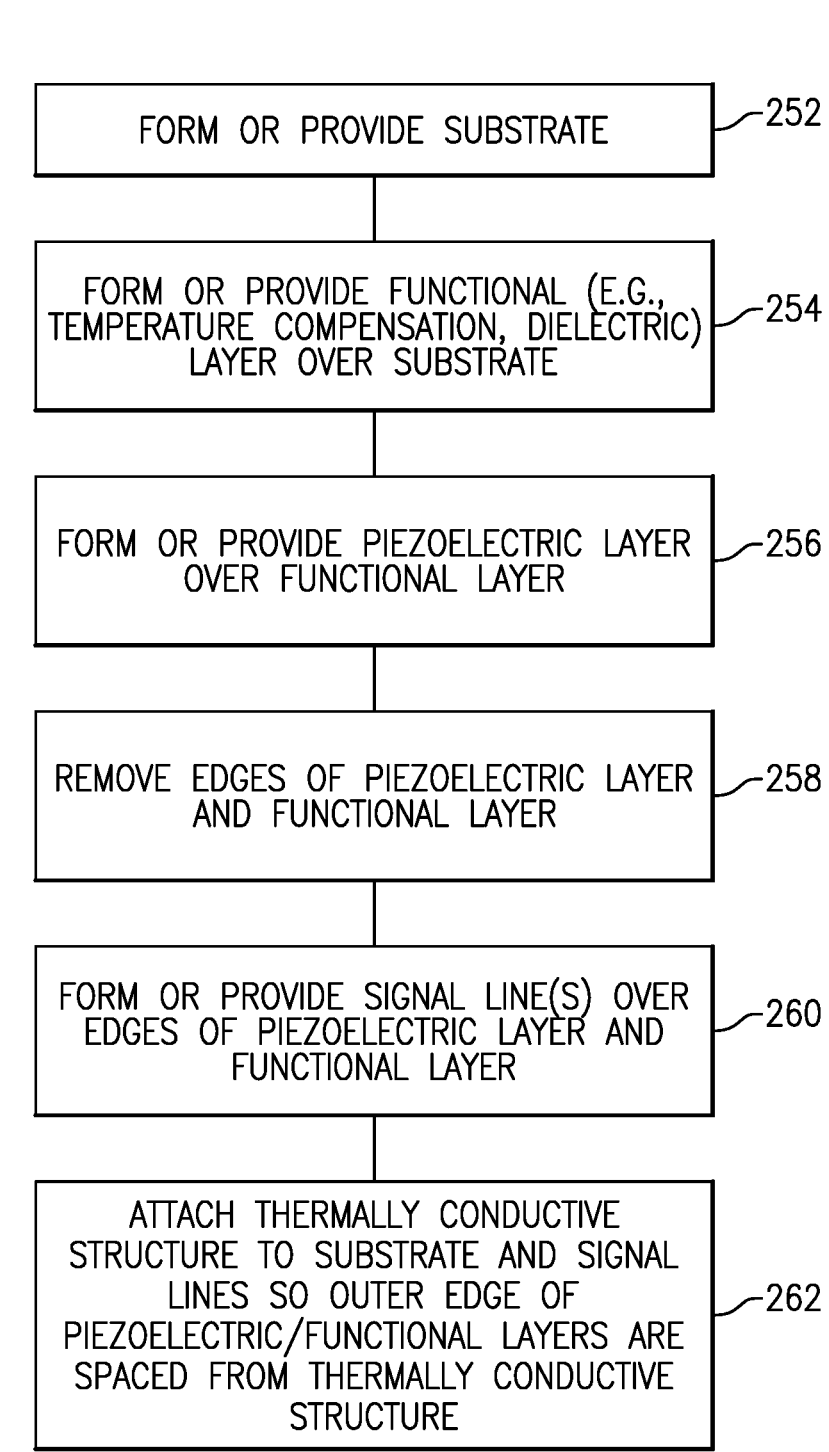

FORM OR PROVIDE SUBSTRATE ⟶252

FORM OR PROVIDE FUNCTIONAL (E.G., TEMPERATURE COMPENSATION, DIELECTRIC) LAYER OVER SUBSTRATE ⟶254

FORM OR PROVIDE PIEZOELECTRIC LAYER OVER FUNCTIONAL LAYER ⟶256

REMOVE EDGES OF PIEZOELECTRIC LAYER AND FUNCTIONAL LAYER ⟶258

FORM OR PROVIDE SIGNAL LINE(S) OVER EDGES OF PIEZOELECTRIC LAYER AND FUNCTIONAL LAYER ⟶260

ATTACH THERMALLY CONDUCTIVE STRUCTURE TO SUBSTRATE AND SIGNAL LINES SO OUTER EDGE OF PIEZOELECTRIC/FUNCTIONAL LAYERS ARE SPACED FROM THERMALLY CONDUCTIVE STRUCTURE ⟶262

FIG.7

METHOD OF MAKING PACKAGED ACOUSTIC WAVE DEVICES WITH MULTILAYER PIEZOELECTRIC SUBSTRATE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed.

The packaging process for multilayer piezoelectric substrate packages can apply stresses to the piezoelectric layer (e.g., during heat cycle testing) that can result in reliability issues including cracking of the piezoelectric layer.

SUMMARY

Accordingly, there is a need for a surface acoustic wave (e.g., SAW or TCSAW) package with improved reliability that can withstand the stresses (e.g., from heat cycle testing) during the packaging process.

In accordance with one aspect of the disclosure, a surface acoustic wave package has a piezoelectric layer over a substrate and a metal structure attached to the substrate. The outer boundary of the piezoelectric layer is removed (e.g., etched) so that a resulting outer edge of the piezoelectric layer is spaced inward of an inner edge of the metal package. The piezoelectric layer does not contact the metal package.

In accordance with one aspect of the disclosure, a method of making a surface acoustic wave package includes bonding a piezoelectric layer over a substrate and attaching a metal structure over the substrate, with the piezoelectric layer positioned between at least a portion of the substrate and at least a portion of the metal structure. The method also includes removing (e.g., etching) an outer boundary of the piezoelectric layer so that a resulting outer edge of the piezoelectric layer is spaced inward of an inner edge of the metal package (e.g., the piezoelectric layer does not contact the metal package).

In accordance with one aspect of the disclosure, a packaged acoustic wave component is provided. The packaged acoustic wave component comprises an acoustic wave device including a substrate, a piezoelectric layer disposed over at least a portion of the substrate and one or more signal lines. A thermally conductive structure is attached to one or both of the substrate and the one or more signal lines. The one or more signal lines interconnect the piezoelectric layer and the thermally conductive structure. The thermally conductive structure is spaced from the piezoelectric layer so an outer edge of the piezoelectric layer is spaced inward of an inner surface of the thermally conductive structure.

In accordance with another aspect of the disclosure, a radio frequency module is provided. The radio frequency module comprises a package substrate. The radio frequency module also comprises a packaged acoustic wave component including an acoustic wave device having a substrate, a piezoelectric layer disposed over at least a portion of the substrate and one or more signal lines. A thermally conductive structure is attached to one or both of the substrate and the one or more signal lines. The one or more signal lines interconnect the piezoelectric layer and the thermally conductive structure. The thermally conductive structure is spaced from the piezoelectric layer so an outer edge of the piezoelectric layer is spaced inward of an inner surface of the thermally conductive structure. The radio frequency module comprises additional circuitry, the packaged acoustic wave component and additional circuitry disposed on the package substrate.

In accordance with another aspect of the disclosure, a wireless communication device is provided. The wireless communication device comprises an antenna and a front end module including one or more packaged acoustic wave components configured to filter a radio frequency signal associated with the antenna. Each surface packaged acoustic wave component includes an acoustic wave device including a substrate, a piezoelectric layer disposed over at least a portion of the substrate and one or more signal lines. A thermally conductive structure is attached to one or both of the substrate and the one or more signal lines. The one or more signal lines interconnect the piezoelectric layer and the thermally conductive structure. The thermally conductive structure is spaced from the piezoelectric layer so an outer edge of the piezoelectric layer is spaced inward of an inner surface of the thermally conductive structure.

In accordance with another aspect of the disclosure, a method of making a packaged acoustic wave component is provided. The method comprises forming an acoustic wave device including forming or providing a substrate, forming or providing a piezoelectric layer over at least a portion of the substrate, and forming or providing one or more signal lines. The method also comprises attaching a thermally conductive structure to one or both of the substrate and the one or more signal lines, the one or more signal lines interconnecting the piezoelectric layer and the thermally conductive structure, the thermally conductive structure being spaced from the piezoelectric layer so an outer edge of the piezoelectric layer is spaced inward of an inner surface of the thermally conductive structure.

In accordance with another aspect of the disclosure, a method of making a radio frequency module is provided. The method comprises forming or providing a package substrate. The method also comprises forming or providing a packaged acoustic wave component including an acoustic wave device including forming or providing a substrate, forming or providing a piezoelectric layer over at least a portion of the substrate, forming or providing one or more signal lines, and attaching a thermally conductive structure to one or both of the substrate and the one or more signal lines, the one or more signal lines interconnecting the piezoelectric layer and the thermally conductive structure, the thermally conductive structure being spaced from the piezoelectric layer so an outer edge of the piezoelectric layer is spaced inward of an inner surface of the thermally conductive structure. The method also comprises attaching additional circuitry and the packaged acoustic wave component to the package substrate.

BRIEF DESCRIPTION OF THE DRAWINGS

Embodiments of this disclosure will now be described, by way of non-limiting example, with reference to the accompanying drawings.

FIG. 7 illustrates a method of making the Multi-layer piezoelectric substrate (MPS) package structure of FIGS. 3-6B.

DETAILED DESCRIPTION

Figure 1:
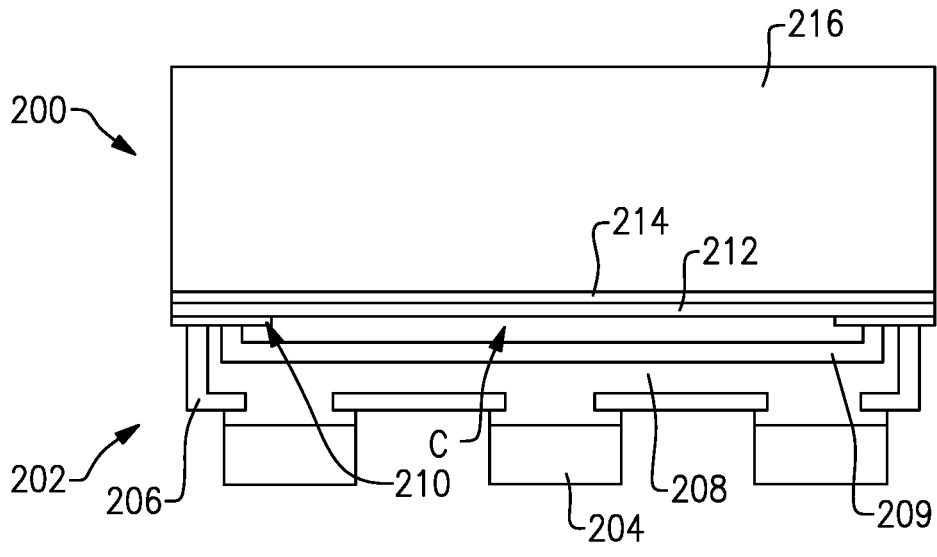
FIG. 1 illustrates a schematic cross-sectional side view of a conventional surface acoustic wave package structure.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) devices. SAW devices include SAW resonators, SAW delay lines, and multi-mode SAW (MMS) filters (e.g., double mode SAW (DMS) filters). Any features of the SAW resonators and/or devices discussed herein can be implemented in any suitable SAW device.

In general, high quality factor (Q), large effective electromechanical coupling coefficient ($k^2$), high frequency ability, and spurious free response can be significant aspects for acoustic wave elements to enable low-loss filters, delay lines, stable oscillators, and sensitive sensors.

Multi-layer piezoelectric substrate (MPS) SAW resonators can thermally insulate an interdigital transducer electrode and a piezoelectric layer. By reducing dissipative thermal impedance of the SAW device, the ruggedness and power handling can be improved.

Some MPS SAW resonators have achieved high Q by confining energy and good thermal dissipation using a silicon (Si) support layer. However, such approaches have encountered technical challenges related to undesirable higher frequency spurious responses.

Some other MPS SAW resonators have achieved high Q by confining energy and have also reduced higher frequency spurious responses. However, such approaches have encountered relatively low thermal heat dissipation.

Aspects of the present disclosure relate to SAW resonators that include a support substrate or layer (e.g., a single crystal supporting substrate), a functional layer (e.g., a dielectric layer) over the support substrate or layer, a piezoelectric layer (e.g., a lithium niobate (LN or LiNbO3) layer or a lithium tantalate (LT or LiTaO3) layer) over the functional layer, and an interdigital transducer (IDT) electrode over the piezoelectric layer. Such SAW resonators can also include a temperature compensation layer (e.g., silicon dioxide (SiO2) layer) over the IDT electrode in certain embodiments. The SAW resonators can also include an adhesion layer disposed between the support substrate and the functional layer and/or an adhesion layer between the functional layer and the piezoelectric layer, in certain applications.

SAW resonators with the functional layer and the support layer or substrate can beneficially provide a relatively high effective electromechanical coupling coefficient ($k^2$), a relatively high quality factor (Q), a relatively high power durability and thermal dissipation, and reduced high frequency spurious responses. The high coupling coefficient ($k^2$) can be beneficial for relatively wide bandwidth filters. The high quality factor (Q) can beneficially lead to a relatively low insertion loss. The reduced high frequency spurious may make the SAW resonators compatible with multiplexing with higher frequency bands.

In an embodiment, an MPS SAW resonator includes a piezoelectric layer over a functional layer over a silicon support substrate or layer. The silicon support substrate can reduce thermal impedance of the MPS SAW resonator. The functional layer can be a single crystal layer arranged to confine acoustic energy and lower a higher frequency spurious response. The piezoelectric layer, the functional layer, and the silicon support substrate can all be single crystal layers.

Embodiments of MPS SAW resonators (e.g., packages) will now be discussed. Any suitable principles and advantages of these MPS SAW resonators can be implemented together with each other in an MPS SAW resonator and/or in an acoustic wave filter. MPS SAW resonators (e.g., packages) disclosed herein can have lower loss than certain bulk acoustic wave devices.

FIG. 1 illustrates a packaged acoustic wave component 200 (e.g., a multi-layer piezoelectric substrate (MPS) package or structure). The component 200 has a substrate 216, an additional (e.g., functional, dielectric) structure or layer 214 disposed over (e.g., bonded to) the substrate 216, and a piezoelectric structure or layer 212 disposed over (e.g. bonded to) the dielectric layer 214. One or more signal lines 210 can be disposed on (e.g., connected to) the piezoelectric layer 212.

With continued reference to FIG. 1, a thermally conductive structure or package 202 is connected to the substrate 216 via the signal line(s) 210, piezoelectric layer 212 and dielectric layer 214. The thermally conductive structure or package 202 includes a metal portion 208, a polyimide layer 209 disposed over at least a portion of the metal portion 208, where the metal portion 208 is shaped so a cavity C (e.g., open or hollow cavity, air cavity) exists between at least a portion of the polyimide layer 209 and at least a portion of the piezoelectric layer 212. The metal portion 208 can be made of copper (Cu). A dielectric overcoat 206 is disposed over at least a portion of the metal portion 208. One or more solder connections 204 are disposed on the metal portion 208 so that the metal portion 208 is between the solder connections 204 and the piezoelectric layer 212. The metal portion 208 connects to the piezoelectric layer 212 via the signal line(s) 210 (e.g., so at least a portion of the piezoelectric layer 212 and dielectric layer 214 are disposed between the signal line(s) 210 and the substrate 216).

During the packaging process, the piezoelectric layer 212 and/or the dielectric layer 214 can be subjected to high stresses, for example due to the different thermal expansion performances of the substrate 216 and the thermally conductive structure or package 202 (e.g., during a heat cycle test), which are transferred to the piezoelectric layer 212 by the metal portion 208 via the signal line(s) 210. Such high stresses can result in damage (e.g., deformation, cracks) to the piezoelectric layer 212 and/or dielectric layer 214.

Figure 2:
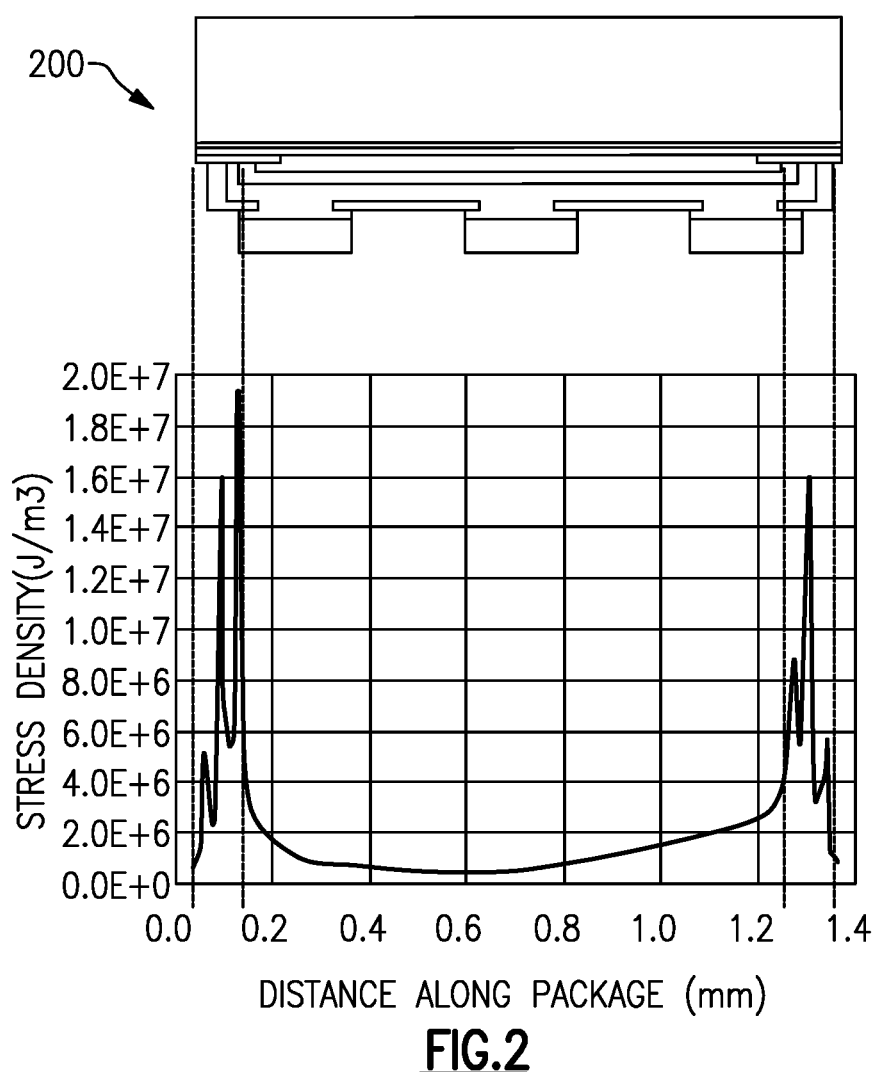
FIG. 2 illustrates a graph of stress density versus distance for the surface acoustic wave package structure of FIG. 1.

FIG. 2 shows a graph of stress density versus distance along the packaged acoustic wave component 200 (e.g., a multi-layer piezoelectric substrate (MPS) package or structure). The graph shows that a high stress density is exhibited at end portions of the piezoelectric layer 212 at locations on the component 200 where the piezoelectric layer 212 is aligned with the metal portion 208 of the thermally conductive structure or package 202 (e.g., locations where the signal line(s) 210 are interposed between the metal portion 208 and piezoelectric layer 212). Such high stresses can result in distortion and/or damage (e.g., cracks) of the piezoelectric layer 212 and the dielectric layer 214.

Figure 3:
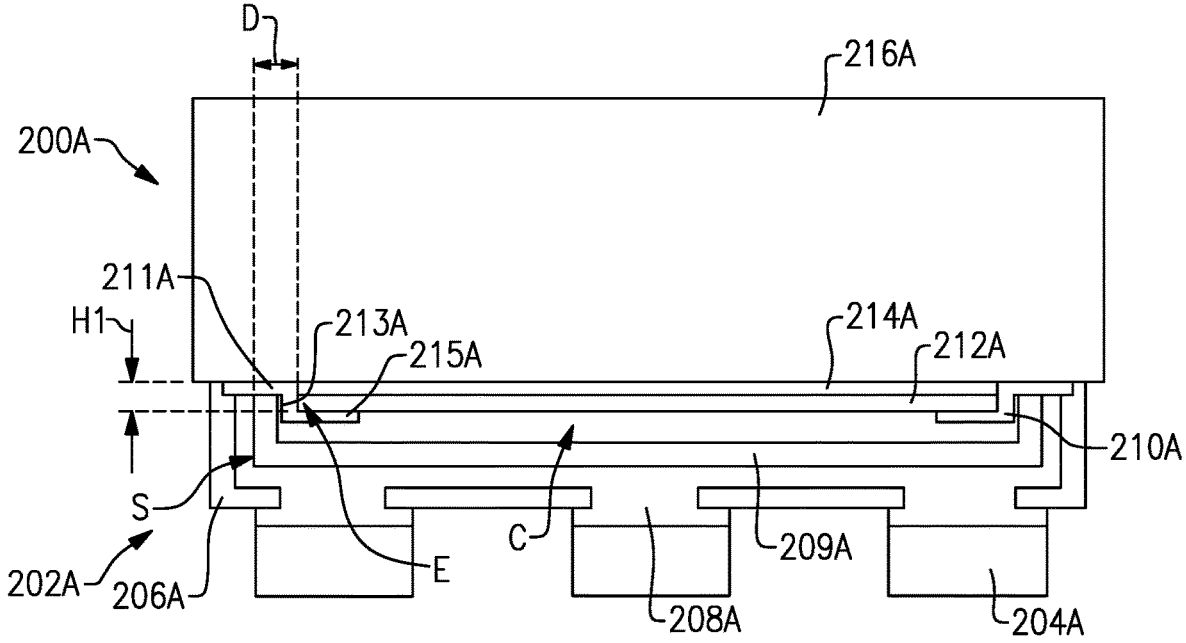
FIG. 3 illustrates a schematic cross-sectional side view of a Multi-layer piezoelectric substrate (MPS) package structure.

FIG. 3 shows a packaged acoustic wave component 200A (e.g., a multi-layer piezoelectric substrate (MPS) package or structure). The packaged acoustic wave component 200A is similar to the packaged acoustic wave component 200 of FIG. 1. Thus, reference numerals used to designate the various components of the packaged acoustic wave component 200A are identical to those used for identifying the corresponding components of the packaged acoustic wave component 200 in FIG. 1, except that an "A" has been added to the numerical identifier. Therefore, the structure and description for the various features and components of the packaged acoustic wave component 200 in FIG. 1 are understood to also apply to the corresponding features of the packaged acoustic wave component 200A in FIG. 3, except as described below.

The substrate 216A can include (e.g., be made of, consist of) silicon (Si). In another example, the substrate 216A can be made of poly-silicon. In another example, the substrate 216A can be made of amorphous silicon. In another example, the substrate 216A can be made of silicon nitride (SiN). In another example, the substrate 216A can be made of Sapphire. In another example, the substrate 216A can be made of quartz. In another example, the substrate 216A can be made of aluminum nitride (AlN). In another example, the substrate 216A can be made of polycrystalline ceramic ($Mg_2O_4$). In another implementation, the substrate 216A can be made of diamond. However, the substrate 216A can be made of other suitable high impedance materials. An acoustic impedance of the substrate 216A can be higher than an acoustic impedance of the piezoelectric structure or layer 212A.

The functional (e.g., temperature compensation, dielectric) structure or layer 214A can have a lower acoustic impedance than the substrate 216A. The functional structure or layer 214A can increase adhesion between the substrate 216A and the piezoelectric structure or layer 212A of the component 200A (e.g., multi-layer piezoelectric substrate (MPS) package or structure). Alternatively or additionally, the functional structure or layer 214A can increase heat dissipation of the component 200A. The functional structure or layer 214A can be made of silicon dioxide (SiO2). In some implementations, the functional structure or layer is excluded from the component or package 200A (e.g., the piezoelectric layer 212A is disposed on, adjacent to or in contact with the substrate 216A).

In one implementation, the piezoelectric layer 212A can be made of lithium niobate (LN or LiNbO3). In another implementation, the piezoelectric layer 212A can be made of lithium tantalate (LT or LiTaO3). Though not shown, one or more resonators (e.g., including an interdigital transducer (IDT) electrode, for example, between two reflectors) can be disposed on (e.g., attached or mounted to) the piezoelectric layer 212A.

With continued reference to FIG. 3, the piezoelectric layer 212A has an outer edge or perimeter E that is spaced from (e.g., spaced inward from) the metal portion 208A (e.g., from an inner surface S of the metal portion 208A) by a distance D. In one example, the distance D can be between 5 microns (0.005 mm) and 15 microns (0.015 mm), such as 5 microns, 10 microns and 15 microns.

The signal line(s) 210A have a first portion 211A adjacent (e.g., in contact with, attached to, bonded to) the substrate 216A and a second portion 215A adjacent (e.g., in contact with, attached to, bonded to) the piezoelectric layer 212A (e.g., a surface of the piezoelectric layer 212A). The first portion 211A and second portion 215A can be spaced from each other by a distance H1 (e.g., extend along parallel planes) so that the signal line(s) 210A have a stepped configuration. The first portion 211A and second portion 215A can be interconnected by a linear portion 213A. In the illustrated implementation, the linear portion 213A extends transverse to (e.g., perpendicular to) the substrate 216A (e.g., to a surface of the substrate 216A), to the first portion 211A and to the second portion 215A. The linear portion 213A can be proximate to (e.g., adjacent to, next to, in contact with) the outer edge E of the piezoelectric layer 212A and/or dielectric layer 214A.

The outer edge E of the piezoelectric layer 212A (and of the dielectric layer 214A) being spaced from the metal portion 208A (e.g., from the inner surface S of the metal portion 208A) advantageously inhibits (e.g. prevents) deformation and damage (e.g., cracks) to the piezoelectric layer 212A (and to the functional layer 214A) due to stresses applied on the component 200A, for example resulting from a different thermal expansion of the substrate 216A and the thermally conductive structure or package 202A (e.g., during heat cycle testing). Additionally, spacing the outer edge E of the piezoelectric layer 212A (and of the functional layer 214A) from the metal portion 208A can advantageously inhibit (e.g., prevent) damage to the resulting dies during dicing (e.g., with a mechanical saw) of the wafer, the dies including the substrate, dielectric and piezoelectric layers used for the component 200A.

Figure 4:
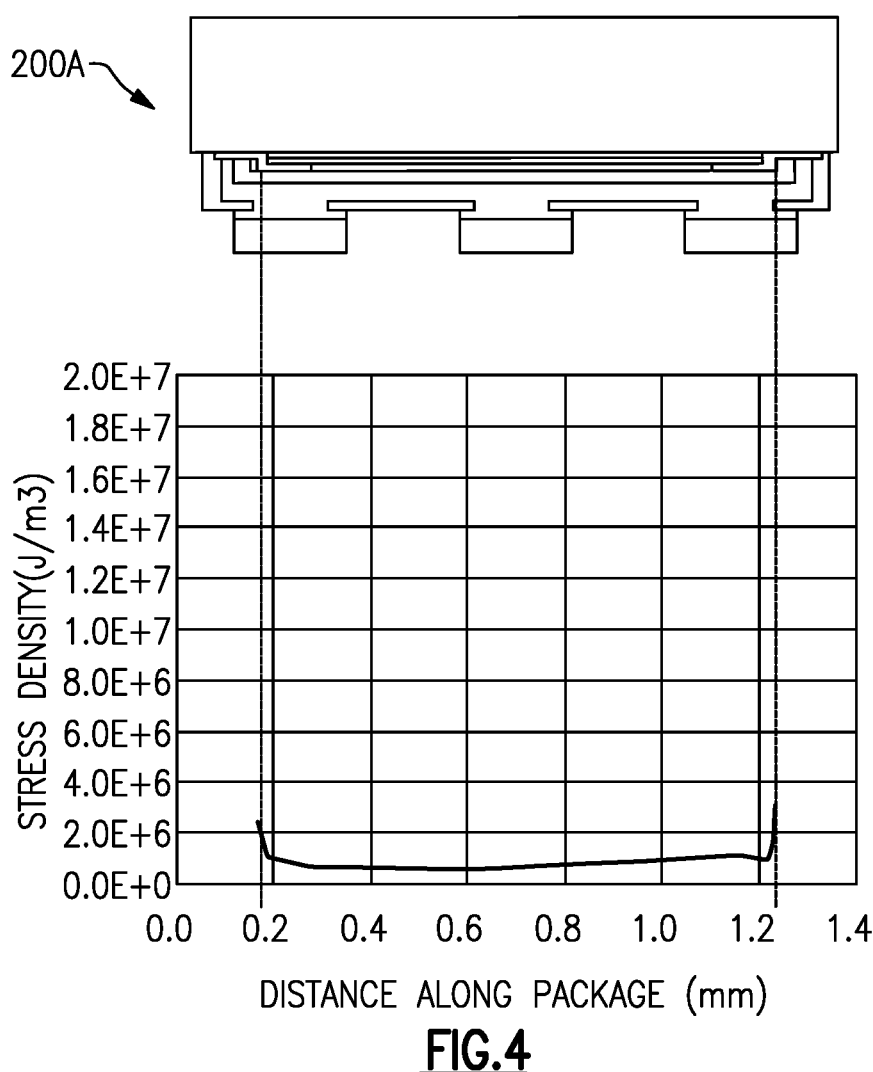
FIG. 4 illustrates a graph of stress density versus distance for the stacked MPS package structure of FIG. 3.

FIG. 4 shows a graph of stress density versus distance along the packaged acoustic wave component 200A (e.g., a multi-layer piezoelectric substrate (MPS) package or structure). The graph shows that high stress and resulting distortion and/or damage to the piezoelectric layer 212A is avoided by having the outer edge of the piezoelectric layer 212A (and of the functional layer 214A) spaced from the metal portion 208A.

Figure 5:
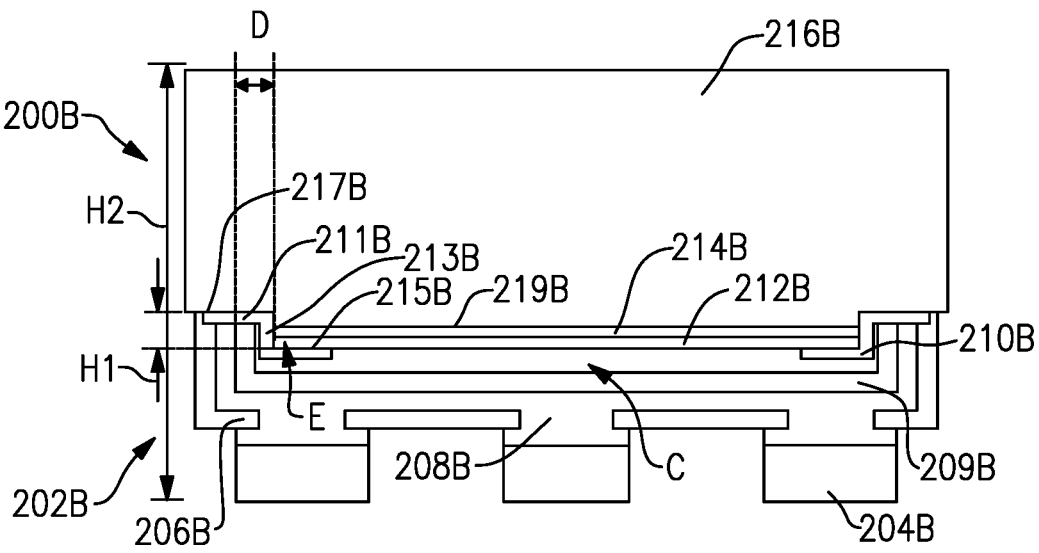
FIG. 5 illustrates a schematic cross-sectional side view of a Multi-layer piezoelectric substrate (MPS) package structure.

FIG. 5 shows a packaged acoustic wave component 200B (e.g., a multi-layer piezoelectric substrate (MPS) package or structure). The packaged acoustic wave component 200B is similar to the packaged acoustic wave component 200A of FIG. 3. Thus, reference numerals used to designate the various components of the packaged acoustic wave component 200B are identical to those used for identifying the corresponding components of the packaged acoustic wave component 200A in FIG. 3, except that a "B" instead of an "A" has been added to the numerical identifier. Therefore, the structure and description for the various features and components of the packaged acoustic wave component 200A in FIG. 3 are understood to also apply to the corresponding features of the packaged acoustic wave component 200B in FIG. 5, except as described below.

The packaged acoustic wave component 200B differs from the component 200A in that the substrate 216B has a first portion 217B that is recessed relative to a second portion 219B. The first portion 211B of the signal line(s) 210B is proximate (e.g., adjacent, next to, in contact with) the first portion 217B of the substrate 216A and the second portion 215B of the signal line(s) 210B is proximate (e.g., adjacent, next to, in contact with) the second portion 219B of the substrate 216B. This results in an overall height H2 of the component or package 200B being smaller (e.g., lower build height) as compared to the component or package 200A, resulting in space savings (e.g., in an electronic device, such as a smartphone, in which the component or package 200B is installed). Additionally, allowing for etching of the substrate 216B results in improved control of the manufacturing process (e.g., since do not need to etch ends of piezoelectric layer 212A without etching the substrate 216B).

Figure 6A:
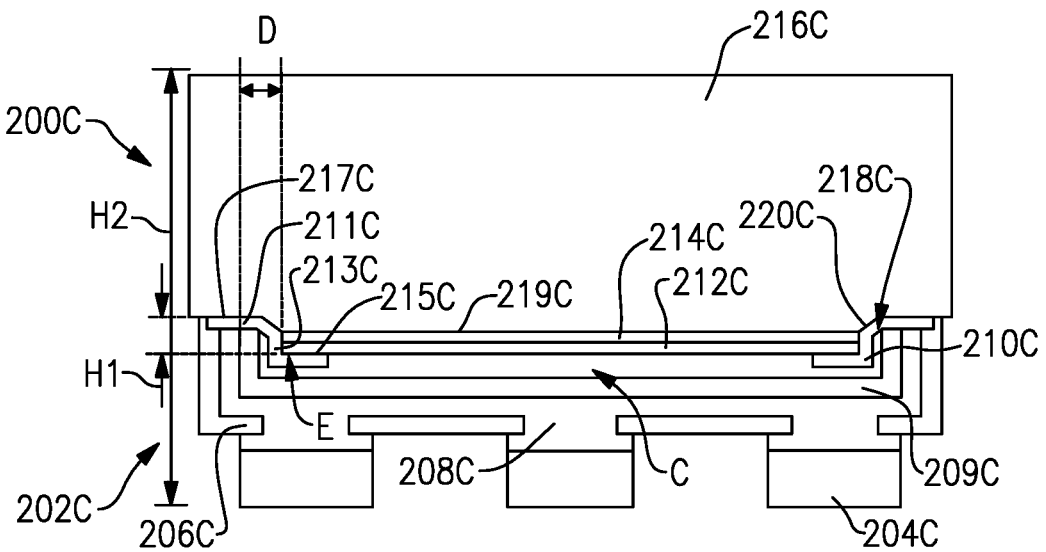
FIG. 6A illustrates a schematic cross-sectional side view of a Multi-layer piezoelectric substrate (MPS) package structure.

FIG. 6A shows a packaged acoustic wave component 200C (e.g., a multi-layer piezoelectric substrate (MPS) package or structure). The packaged acoustic wave component 200C is similar to the packaged acoustic wave component 200B of FIG. 5. Thus, reference numerals used to designate the various components of the packaged acoustic wave component 200C are identical to those used for identifying the corresponding components of the packaged acoustic wave component 200B in FIG. 5, except that a "C" instead of a "B" has been added to the numerical identifier. Therefore, the structure and description for the various features and components of the packaged acoustic wave component 200B in FIG. 5 (which is based on the structure and description for the component 200A of FIG. 3) are understood to also apply to the corresponding features of the packaged acoustic wave component 200C in FIG. 6A, except as described below.

The packaged acoustic wave component 200C differs from the component 200B in that the substrate 216C has an angled portion 220C between the first portion 217C and the second portion 219C. The signal line(s) 210C have a stepped configuration with an angled portion 218C between the first portion 211C and the second portion 215C (e.g., between the first portion 211C and the linear portion 213C that is proximate the outer edge E of the piezoelectric layer 212C and dielectric layer 212C). The angled portion 218C of the signal line(s) 210C can be adjacent (e.g., next to, in contact with) the angled portion 220C of the substrate 216C. The angled portion 218C of the signal line(s) 210C can advantageously improve a continuity of a signal through the signal line(s) 210C as compared to the signal line(s) 210B where the stepped configuration with the linear portion 213B perpendicular to the first and second portions 211B, 215B can result in a reduction of signals through the signal line(s) 210B.

Figure 6B:
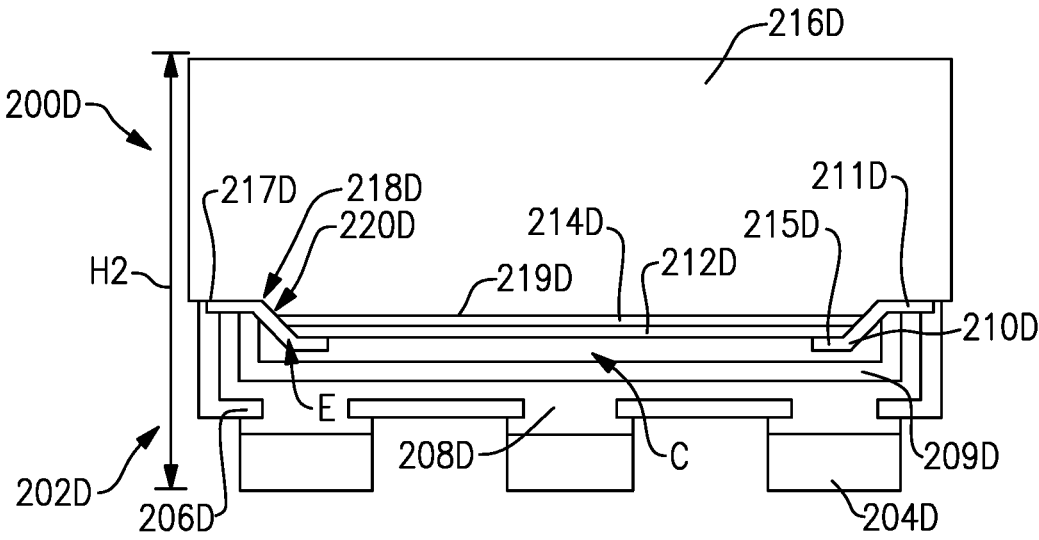
FIG. 6B illustrates a schematic cross-sectional side view of a Multi-layer piezoelectric substrate (MPS) package structure.

FIG. 6B shows a packaged acoustic wave component 200D (e.g., a multi-layer piezoelectric substrate (MPS) package or structure). The packaged acoustic wave component 200D is similar to the packaged acoustic wave component 200C of FIG. 6A. Thus, reference numerals used to designate the various components of the packaged acoustic wave component 200D are identical to those used for identifying the corresponding components of the packaged acoustic wave component 200C in FIG. 6A, except that a "D" instead of a "C" has been added to the numerical identifier. Therefore, the structure and description for the various features and components of the packaged acoustic wave component 200C in FIG. 6A (which is based on the structure and description for the component 200A of FIG. 3) are understood to also apply to the corresponding features of the packaged acoustic wave component 200D in FIG. 6B, except as described below.

The packaged acoustic wave component 200D differs from the component 200C in that the outer edge E of the piezoelectric layer 212D (and the functional layer 214D) is angled (e.g., extends at a non-perpendicular angle relative to a surface of the substrate 216D over which the piezoelectric layer 212D is bonded). In one example, the outer edge E can extend at an acute angle (e.g., less than 90 degrees) relative to the surface of the substrate 216D over which the piezoelectric layer 212D is bonded. The angled portion 218D of the signal line(s) 210D extend from the first portion 211D to the second portion 215D at the same angle as the outer edge E of the piezoelectric layer 212D (and the functional layer 214D).

FIG. 7 illustrates a method 250 of making a packaged acoustic wave component (e.g., a multi-layer piezoelectric substrate (MPS) package or structure), such as the component 200A-200D in FIGS. 3, 5-6B. The method 250 includes the step 252 of forming or providing a substrate (e.g., substrate 216A-216D). The method 250 includes the step 254 of forming or providing a functional (e.g., temperature compensation, dielectric) structure or layer (such as the functional layer 214A-214D) over the substrate. The method 250 includes the step 256 of forming or providing a piezoelectric structure or layer (such as the piezoelectric layer 212A-212D) over the functional layer. The method 250 includes the step 258 of removing (e.g., etching) an outer edge or boundary of the piezoelectric layer and functional layer. The method 250 include the step 260 of forming or providing signal line(s) (such as signal line(s) 210A-210D) over outer edges (e.g., outer edges E) of the piezoelectric layer and functional layer. The method 250 includes the step 262 of attaching a thermally conductive structure (such as thermally conductive structure 202A-202D) to the substrate and signal lines so the outer edge of the piezoelectric layer and functional layer are spaced from the thermally conductive structure (e.g., an outer edge of the piezoelectric layer is spaced inward of an inner surface of the thermally conductive structure). In one implementation, a method of making a radio frequency module includes the steps above for method 250 in addition to forming or providing a package substrate and attaching additional circuitry and the packaged acoustic wave component to the package substrate.

Advantageously, the MPS package structure 200A-200D reduces the mechanical stress the piezoelectric and/or dielectric layers are subjected to (e.g., during heat cycle testing due to the different thermal expansion characteristics of the substrate and the metal structure attached to the substrate) and avoid cracks or breaks therein. This results in improved reliability and mechanical ruggedness of the acoustic wave devices and MPS package structure 200A-200D. Such temperature performance advantageously allows use of the MPS package structure 200A-200D for high power applications (e.g., in a high power transmit filter). It also allows for a size reduction in the MPS package structure 200B-200D, as described above.

An MPS acoustic wave resonator or device or die in a packaged acoustic wave component, including any suitable combination of features disclosed herein, can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more MPS acoustic wave resonators disclosed herein. FR1 can be from 410 MHz to 7.125 GHz, for example, as specified in a current 5G NR specification. In 5G applications, the thermal dissipation of the MPS acoustic wave resonators disclosed herein can be advantageous. For example, such thermal dissipation can be desirable in 5G applications with a higher time-division duplexing (TDD) duty cycle compared to fourth generation (4G) Long Term Evolution (LTE). One or more MPS acoustic wave resonators in accordance with any suitable principles and advantages disclosed herein can be included in a filter arranged to filter a radio frequency signal in a 4G LTE operating band and/or in a filter having a passband that includes a 4G LTE operating band and a 5G NR operating band.

Figures 8A, 8B:
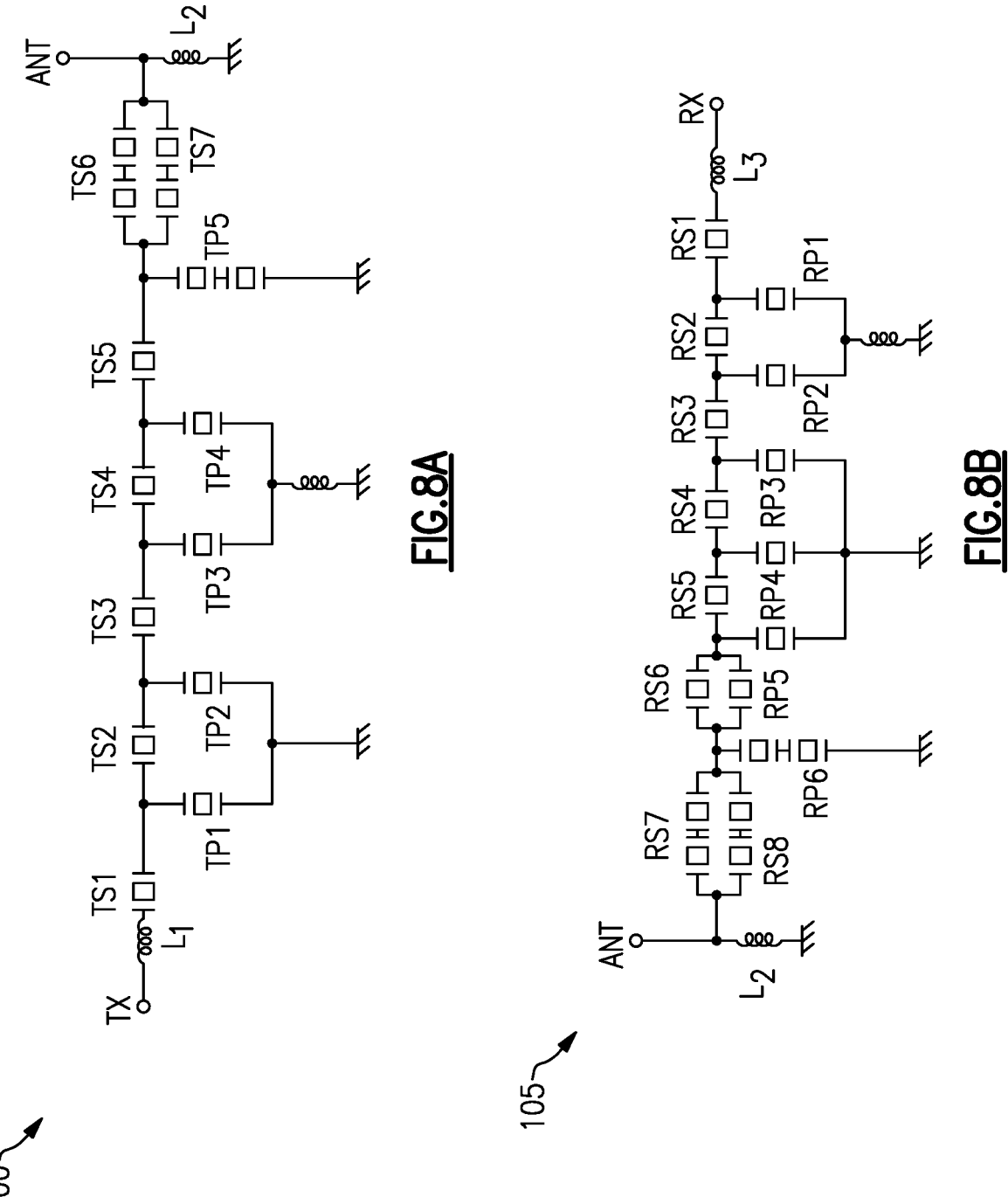
FIG. 8A is a schematic diagram of a transmit filter that includes a surface acoustic wave resonator according to an embodiment.
FIG. 8B is a schematic diagram of a receive filter that includes a surface acoustic wave resonator according to an embodiment.

FIG. 8A is a schematic diagram of an example transmit filter 100 that includes surface acoustic wave resonators according to an embodiment. The transmit filter 100 can be a band pass filter. The illustrated transmit filter 100 is arranged to filter a radio frequency signal received at a transmit port TX and provide a filtered output signal to an antenna port ANT. Some or all of the SAW resonators TS1 to TS7 and/or TP1 to TP5 can be a SAW resonator in accordance with any suitable principles and advantages disclosed herein. For instance, one or more of the SAW resonators of the transmit filter 100 can be part of one or more of the acoustic wave package 200A-200D of FIGS. 3-6B. Any suitable number of series SAW resonators and shunt SAW resonators can be included in a transmit filter 100.

FIG. 8B is a schematic diagram of a receive filter 105 that includes surface acoustic wave resonators according to an embodiment. The receive filter 105 can be a band pass filter. The illustrated receive filter 105 is arranged to filter a radio frequency signal received at an antenna port ANT and provide a filtered output signal to a receive port RX. Some or all of the SAW resonators RS1 to RS8 and/or RP1 to RP6 can be SAW resonators in accordance with any suitable principles and advantages disclosed herein. For instance, one or more of the SAW resonators of the receive filter 105 can be part of one or more of the acoustic wave package 200A-200D. Any suitable number of series SAW resonators and shunt SAW resonators can be included in a receive filter 105.

Although FIGS. 8A and 8B illustrate example ladder filter topologies, any suitable filter topology can include a SAW resonator in accordance with any suitable principles and advantages disclosed herein. Example filter topologies include ladder topology, a lattice topology, a hybrid ladder and lattice topology, a multi-mode SAW filter, a multi-mode SAW filter combined with one or more other SAW resonators, and the like.

Figure 9:
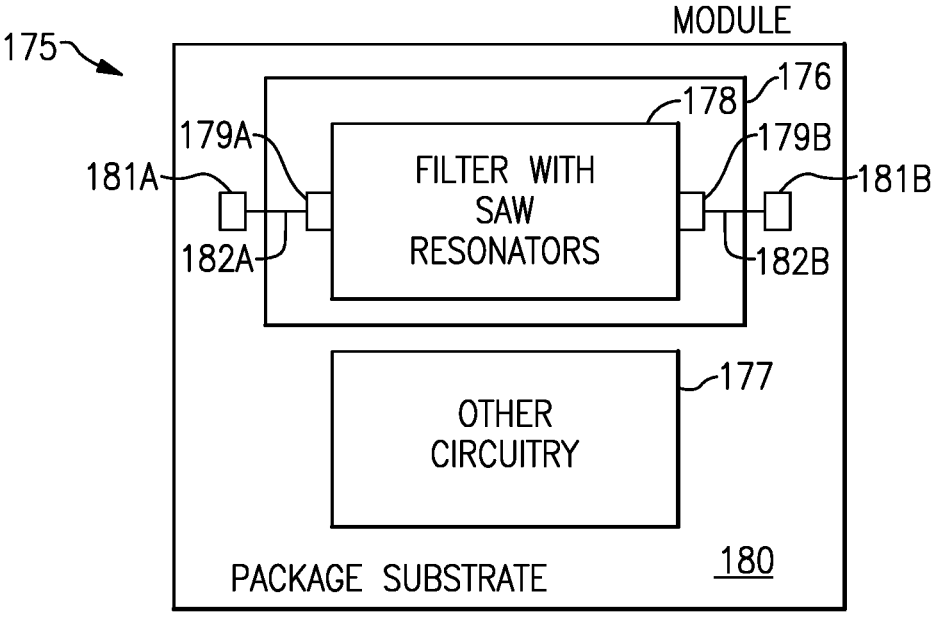
FIG. 9 is a schematic diagram of a radio frequency module that includes a surface acoustic wave resonator according to an embodiment.

FIG. 9 is a schematic diagram of a radio frequency module 175 that includes a surface acoustic wave component 176 according to an embodiment. The illustrated radio frequency module 175 includes the SAW component 176 and other circuitry 177. The SAW component 176 can include one or more SAW resonators with any suitable combination of features of the SAW resonators or packages disclosed herein. The SAW component 176 can include a SAW die that includes SAW resonators.

The SAW component 176 shown in FIG. 9 includes a filter 178 and terminals 179A and 179B. The filter 178 includes SAW resonators. One or more of the SAW resonators can be implemented in accordance with any suitable principles and advantages of the acoustic wave packages 200A-200D of FIGS. 3-6B. The terminals 179A and 178B can serve, for example, as an input contact and an output contact. The SAW component 176 and the other circuitry 177 are on a common packaging substrate 180 in FIG. 9. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate 180. The overmold structure can encapsulate some or all of the components of the radio frequency module 175.

Figure 10:
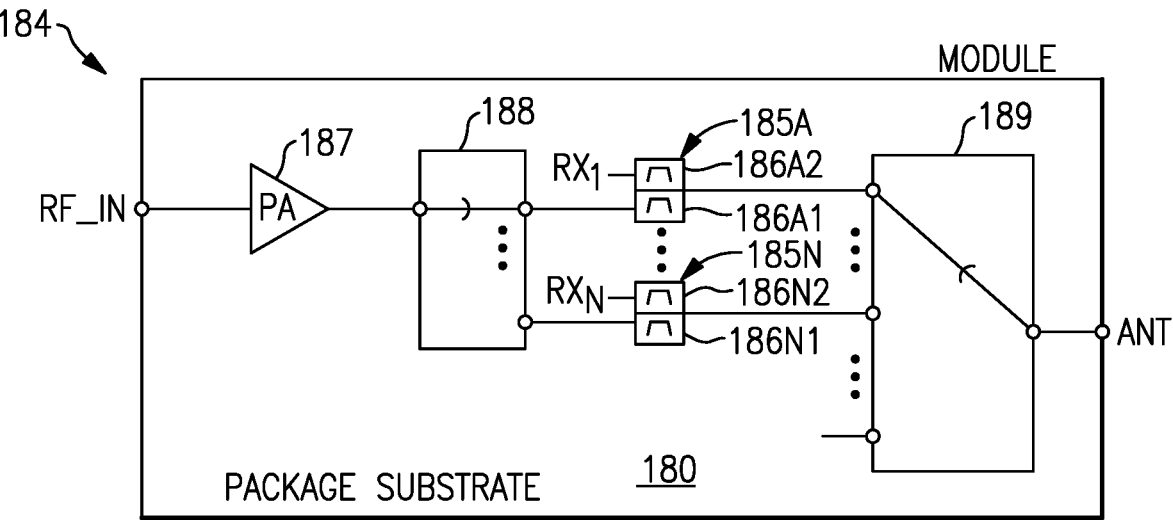
FIG. 10 is a schematic diagram of a radio frequency module that includes filters with surface acoustic wave resonators according to an embodiment.

FIG. 10 is a schematic diagram of a radio frequency module 184 that includes a surface acoustic wave resonator according to an embodiment. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators or packages in accordance with any suitable principles and advantages disclosed herein. Similarly, one or more of the receive filters 186A2 to 186N2 can include one or more SAW resonators in accordance with any suitable principles and advantages disclosed herein. Although FIG. 10 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 11:
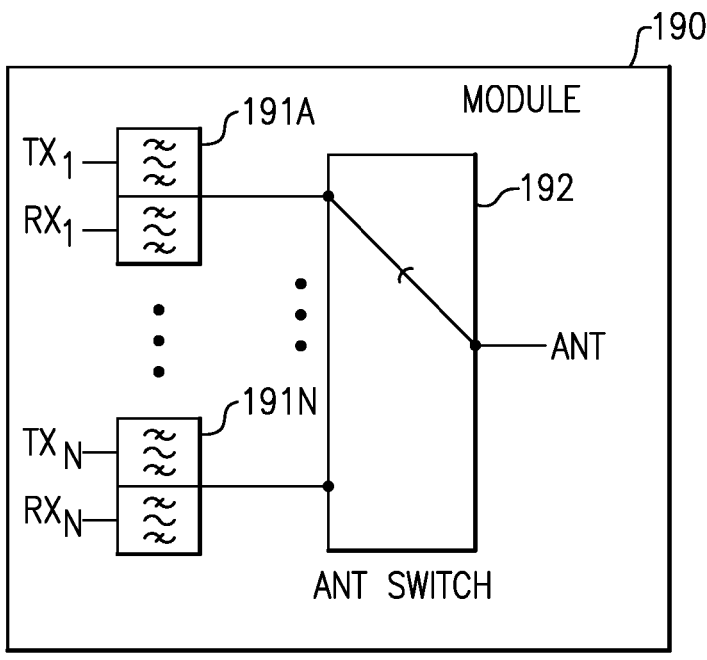
FIG. 11 is a schematic block diagram of a module that includes an antenna switch and duplexers that include a surface acoustic wave resonator according to an embodiment.

FIG. 11 is a schematic block diagram of a module 190 that includes duplexers 191A to 191N and an antenna switch 192. One or more filters of the duplexers 191A to 191N can include any suitable number of surface acoustic wave resonators or packages in accordance with any suitable principles and advantages discussed herein. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 12A:
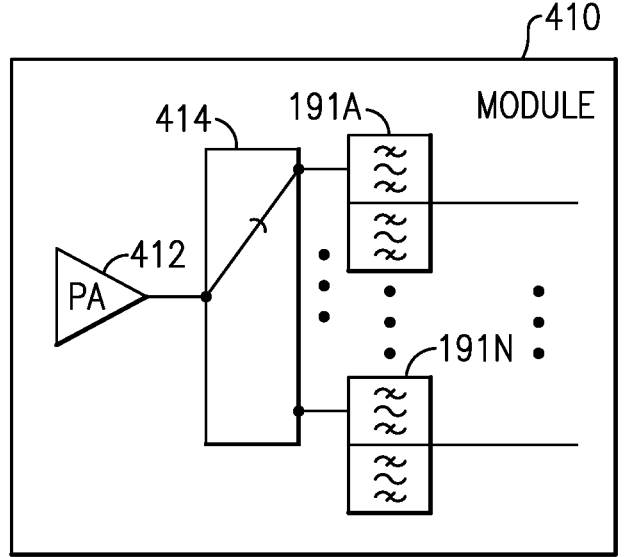
FIG. 12A is a schematic block diagram of a module that includes a power amplifier, a radio frequency switch, and duplexers that include a surface acoustic wave resonator according to an embodiment.

FIG. 12A is a schematic block diagram of a module 410 that includes a power amplifier 412, a radio frequency switch 414, and duplexers 191A to 191N in accordance with one or more embodiments. The power amplifier 412 can amplify a radio frequency signal. The radio frequency switch 414 can be a multi-throw radio frequency switch. The radio frequency switch 414 can electrically couple an output of the power amplifier 412 to a selected transmit filter of the duplexers 191A to 191N. One or more filters of the duplexers 191A to 191N can include any suitable number of surface acoustic wave resonators or packages in accordance with any suitable principles and advantages discussed herein. Any suitable number of duplexers 191A to 191N can be implemented.

Figure 12B:
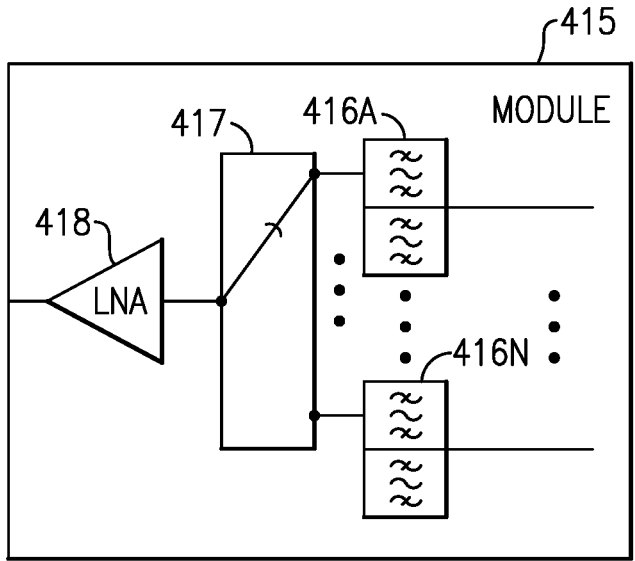
FIG. 12B is a schematic block diagram of a module that includes filters, a radio frequency switch, and a low noise amplifier according to an embodiment.

FIG. 12B is a schematic block diagram of a module 415 that includes filters 416A to 416N, a radio frequency switch 417, and a low noise amplifier 418 according to an embodiment. One or more filters of the filters 416A to 416N can include any suitable number of acoustic wave resonators or packages in accordance with any suitable principles and advantages disclosed herein. Any suitable number of filters 416A to 416N can be implemented. The illustrated filters 416A to 416N are receive filters. In some embodiments (not illustrated), one or more of the filters 416A to 416N can be included in a multiplexer that also includes a transmit filter. The radio frequency switch 417 can be a multi-throw radio frequency switch. The radio frequency switch 417 can electrically couple an output of a selected filter of filters 416A to 416N to the low noise amplifier 418. In some embodiments (not illustrated), a plurality of low noise amplifiers can be implemented. The module 415 can include diversity receive features in certain applications.

Figure 13A:
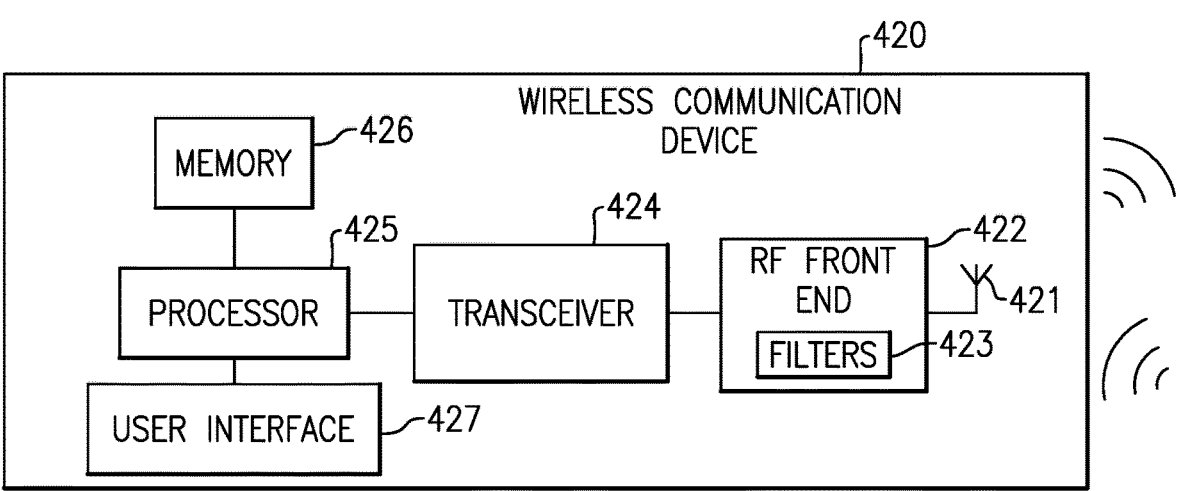
FIG. 13A is a schematic block diagram of a wireless communication device that includes a filter with a surface acoustic wave resonator in accordance with one or more embodiments.

FIG. 13A is a schematic diagram of a wireless communication device 420 that includes filters 423 in a radio frequency front end 422 according to an embodiment. The filters 423 can include one or more SAW resonators or packages in accordance with any suitable principles and advantages discussed herein. The wireless communication device 420 can be any suitable wireless communication device. For instance, a wireless communication device 420 can be a mobile phone, such as a smart phone. As illustrated, the wireless communication device 420 includes an antenna 421, an RF front end 422, a transceiver 424, a processor 425, a memory 426, and a user interface 427. The antenna 421 can transmit/receive RF signals provided by the RF front end 422. Such RF signals can include carrier aggregation signals. Although not illustrated, the wireless communication device 420 can include a microphone and a speaker in certain applications.

The RF front end 422 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 422 can transmit and receive RF signals associated with any suitable communication standards. The filters 423 can include SAW resonators of a SAW component or package that includes any suitable combination of features discussed with reference to any embodiments discussed above.

The transceiver 424 can provide RF signals to the RF front end 422 for amplification and/or other processing. The transceiver 424 can also process an RF signal provided by a low noise amplifier of the RF front end 422. The transceiver 424 is in communication with the processor 425. The processor 425 can be a baseband processor. The processor 425 can provide any suitable base band processing functions for the wireless communication device 420. The memory 426 can be accessed by the processor 425. The memory 426 can store any suitable data for the wireless communication device 420. The user interface 427 can be any suitable user interface, such as a display with touch screen capabilities.

Figure 13B:
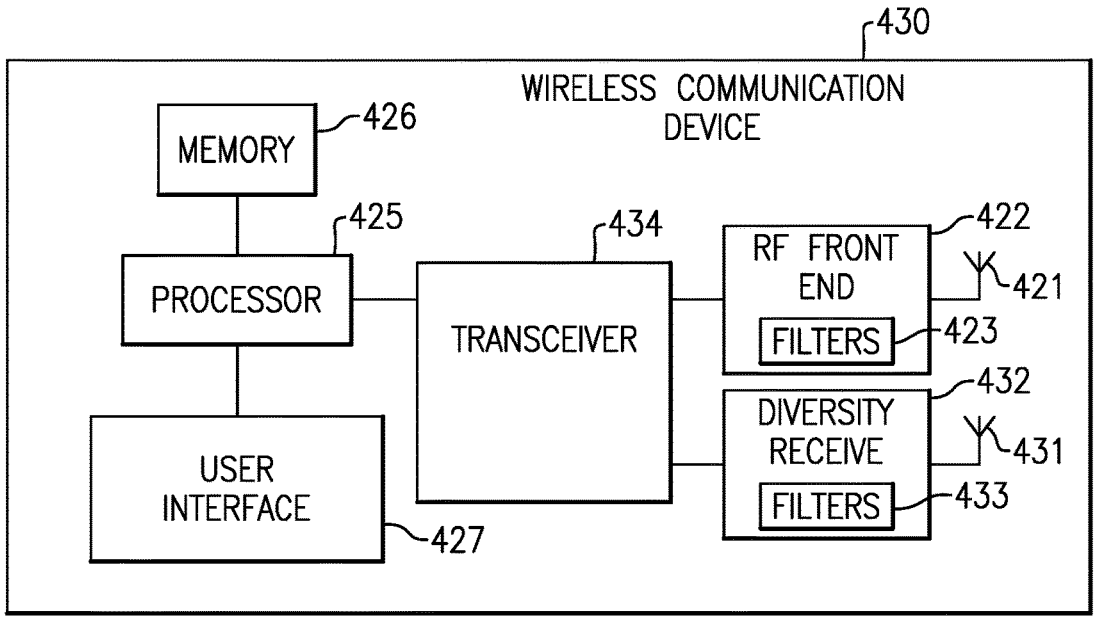
FIG. 13B is a schematic block diagram of another wireless communication device that includes a filter with a surface acoustic wave resonator in accordance with one or more embodiments.

FIG. 13B is a schematic diagram of a wireless communication device 430 that includes filters 423 in a radio frequency front end 422 and a second filter 433 in a diversity receive module 432. The wireless communication device 430 is like the wireless communication device 400 of FIG. 13A, except that the wireless communication device 430 also includes diversity receive features. As illustrated in FIG. 13B, the wireless communication device 430 includes a diversity antenna 431, a diversity module 432 configured to process signals received by the diversity antenna 431 and including filters 433, and a transceiver 434 in communication with both the radio frequency front end 422 and the diversity receive module 432. The filters 433 can include one or more SAW resonators or packages that include any suitable combination of features discussed with reference to any embodiments discussed above.

Although embodiments disclosed herein relate to surface acoustic wave resonators or packages, any suitable principles and advantages disclosed herein can be applied to other types of acoustic wave resonators that include an IDT electrode, such as Lamb wave resonators and/or boundary wave resonators. For example, any suitable combination of features of the tilted and rotated IDT electrodes disclosed herein can be applied to a Lamb wave resonator and/or a boundary wave resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A method of making a packaged acoustic wave component comprising:

forming an acoustic wave device including forming or providing a substrate, forming or providing a dielectric layer over at least a portion of the substrate, forming or providing a piezoelectric layer over at least a portion of the dielectric layer, and forming or providing one or more signal lines including forming or providing a first signal line that extends over a first end of the piezoelectric layer and forming or providing a second signal line that extends over a second end of the piezoelectric layer opposite the first end, each of the first and second signal lines including a first portion recessed in the substrate and a second portion on the piezoelectric layer, the first portion recessed in the substrate having a top surface that is below the dielectric layer;

attaching a thermally conductive metal structure to both the substrate and the one or more signal lines, the one or more signal lines interconnecting the piezoelectric layer and the thermally conductive metal structure, the thermally conductive metal structure being spaced from the piezoelectric layer so an outer edge of the piezoelectric layer is spaced inward of an inner surface of the thermally conductive metal structure, the thermally conductive metal structure covering the piezoelectric layer to form a cavity over the piezoelectric layer;

and forming or providing a polyimide layer over a surface of the thermally conductive metal structure so that the polyimide layer is on an inside of the cavity opposite the piezoelectric layer.

2. The method of claim 1 wherein the thermally conductive metal structure is spaced from the dielectric layer so an outer edge of the dielectric layer is spaced inward of an inner surface of the thermally conductive metal structure.

3. The method of claim 1 wherein forming the acoustic wave device includes etching an outer boundary of the piezoelectric layer so that the outer edge of the piezoelectric layer is spaced inward of the inner surface of the thermally conductive metal structure by a distance of approximately 5-15 microns.

4. The method of claim 1 wherein the first portion and the second portion extend along parallel planes that are spaced from each other and have a substantially stepped configuration.

5. The method of claim 1 wherein forming or providing the substrate includes forming a recessed portion of the substrate that attaches to the thermally conductive metal structure relative to a portion of the substrate disposed under the piezoelectric layer.

6. The method of claim 1 wherein forming or providing the one or more signal lines includes forming or providing a linear portion proximate and parallel to the outer edge of the piezoelectric layer.

7. The method of claim 6 wherein forming or providing the linear portion includes forming or providing the linear portion to extend perpendicular to the substrate.

8. The method of claim 1 wherein forming or providing the one or more signal lines include forming or providing an angled portion adjacent a corresponding angled portion of the substrate that is between a portion of the substrate attached to the thermally conductive metal structure and a portion of the substrate disposed under the piezoelectric layer.

9. The method of claim 6 wherein forming or providing the linear portion includes forming or providing the linear portion to extend at a non-perpendicular angle relative to the substrate, the outer edge of the piezoelectric layer extending at said non-perpendicular angle relative to the substrate.

10. A method of making a radio frequency module comprising:

forming or providing a package substrate;

forming or providing a packaged acoustic wave component including an acoustic wave device including forming or providing a substrate, forming or providing a dielectric layer over at least a portion of the substrate, forming or providing a piezoelectric layer over at least a portion of the dielectric layer, forming or providing one or more signal lines including forming or providing a first signal line that extends over a first end of the piezoelectric layer and forming or providing a second signal line that extends over a second end of the piezoelectric layer opposite the first end, each of the first and second signal lines including a first portion recessed in the substrate and a second portion of the piezoelectric layer, the first portion recessed in the substrate having a top surface that is below the dielectric layer, and attaching a thermally conductive metal structure to both the substrate and the one or more signal lines, the one or more signal lines interconnecting the piezoelectric layer and the thermally conductive metal structure, the thermally conductive metal structure being spaced from the piezoelectric layer so an outer edge of the piezoelectric layer is spaced inward of an inner surface of the thermally conductive metal structure, the thermally conductive metal structure covering the piezoelectric layer to form a cavity over the piezoelectric layer, and forming or providing a polyimide layer on a surface of the thermally conductive metal structure so that the polyimide layer is on an inside of the cavity opposite the piezoelectric layer; and attaching additional circuitry and the packaged acoustic wave component to the package substrate.

11. The method of claim 10 wherein the thermally conductive metal structure is spaced from the dielectric layer so an outer edge of the dielectric layer is spaced inward of an inner surface of the thermally conductive metal structure.

12. The method of claim 10 wherein forming the acoustic wave device includes etching an outer boundary of the piezoelectric layer so that the outer edge of the piezoelectric layer is spaced inward of the inner surface of the thermally conductive metal structure by a distance of approximately 5-15 microns.

13. The method of claim 10 wherein the first portion and the second portion extend along parallel planes that are spaced from each other and have a substantially stepped configuration.

14. The method of claim 10 wherein forming or providing the substrate includes forming a recessed portion of the substrate that attaches to the thermally conductive metal structure relative to a portion of the substrate disposed under the piezoelectric layer.

15. The method of claim 10 wherein forming or providing the one or more signal lines includes forming or providing a linear portion proximate and parallel to the outer edge of the piezoelectric layer.

16. The method of claim 15 wherein forming or providing the linear portion includes forming or providing the linear portion to extend perpendicular to the substrate.

17. The method of claim 10 wherein forming or providing the one or more signal lines include forming or providing an angled portion adjacent a corresponding angled portion of the substrate that is between a portion of the substrate attached to the thermally conductive metal structure and a portion of the substrate disposed under the piezoelectric layer.

18. The method of claim 15 wherein forming or providing the linear portion includes forming or providing the linear portion to extend at a non-perpendicular angle relative to the substrate, the outer edge of the piezoelectric layer extending at said non-perpendicular angle relative to the substrate.

19. The method of claim 10 further forming or providing one or more solder connections positioned on the thermally conductive metal structure over the cavity above the piezoelectric layer.

20. The method of claim 19 further forming or providing one or more solder connections positioned on the thermally conductive metal structure over a center portion of the cavity above the piezoelectric layer.

* * * * *